United States Patent [19]
Ling

[11] Patent Number: 5,811,852
[45] Date of Patent: Sep. 22, 1998

[54] MEMORY CELL STRUCTURE FABRICATED WITH IMPROVED FABRICATION PROCESS BY FORMING DIELECTRIC LAYER DIRECTLY ON AN INSULATED SURFACE OF A SUBSTRATE

[75] Inventor: Peiching Ling, San Jose, Calif.

[73] Assignee: Advanced Materials Engineering Research, Inc., Sunnyvale, Calif.

[21] Appl. No.: 587,952

[22] Filed: Jan. 17, 1996

[51] Int. Cl.$^6$ .................................................. H01L 29/788
[52] U.S. Cl. ......................... 257/315; 257/314; 257/316; 257/317; 257/318; 257/320; 437/43; 437/52
[58] Field of Search .................................. 257/314, 315, 257/316, 317, 318, 320; 437/43, 52

[56] References Cited

U.S. PATENT DOCUMENTS

| | | | |
|---|---|---|---|
| 4,616,245 | 10/1986 | Topich et al. | 257/318 |
| 5,223,731 | 6/1993 | Lee | 257/318 |

FOREIGN PATENT DOCUMENTS

| | | | |
|---|---|---|---|
| 62-266872 | 11/1987 | Japan | 257/317 |

*Primary Examiner*—Valencia Martin Wallace
*Attorney, Agent, or Firm*—Bo-In Lin

[57] ABSTRACT

This invention discloses a programmable read-only-memory (PROM). The PROM is formed and supported on a substrate. The PROM includes a transistor region in the substrate including a source region, a drain region and a floating gate region disposed between the drain region and the source region. The PROM further includes a floating gate formed on top of the floating gate region with a single poly layer on the substrate. The PROM further includes a floating gate extension region disposed near the transistor region, the floating gate extension region is connected with the floating gate region. The PROM further includes a control gate formed on the substrate near the floating gate extension region opposite the transistor region whereby a charge state of the floating gate extension region is controlled by the control gate.

25 Claims, 6 Drawing Sheets

MEMORY CELL STRUCTURE FABRICATED WITH IMPROVED FABRICATION PROCESS BY FORMING DIELECTRIC LAYER DIRECTLY ON AN INSULATED SURFACE OF A SUBSTRATE

BACKGROUND OF THE INVENTION

1. Field of the Invention

This invention relates generally to the structure and fabrication process of semiconductor memory devices. More particularly, this invention relates to a novel and improved structure and process for fabricating a memory devices wherein a process of forming a dielectric layer, e.g., an ONO (oxide-nitride-oxide) layer directly on a silicon substrate is applied to simplify processing steps with reduced step height while achieving better layer quality resulting in better charge retention control.

2. Description of the Prior Art

Conventional structure and processing steps for fabricating a programmable read-only-memory (PROM) or a flash memory array are limited by several technical difficulties. The difficulties are often caused by a dielectric layer, which is to be formed on top of a polysilicon layer, e.g., a floating gate, underneath a control gate. The dielectric layer is often formed with poor quality due to the fact that the surface conditions of a polysilicon layer are closely related to the grain size of the polysilicon material which will in turn affect the topological profiles of the dielectric layer formed thereon. The surface of a dielectric layer, e.g. an ONO layer, is not flat due to the irregularity of the polysilicon grain size. This often causes a technical problem that the reliability of charge retention in a PROM cell with such a structure is adversely affected.

Figure 1A:
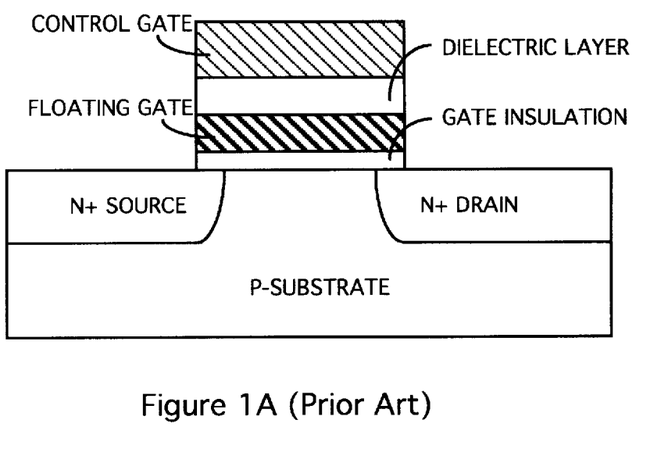
FIGS. 1A to 1C are a cross-sectional view of structures memory cells of prior art EPROM devices.
Figure 1B:
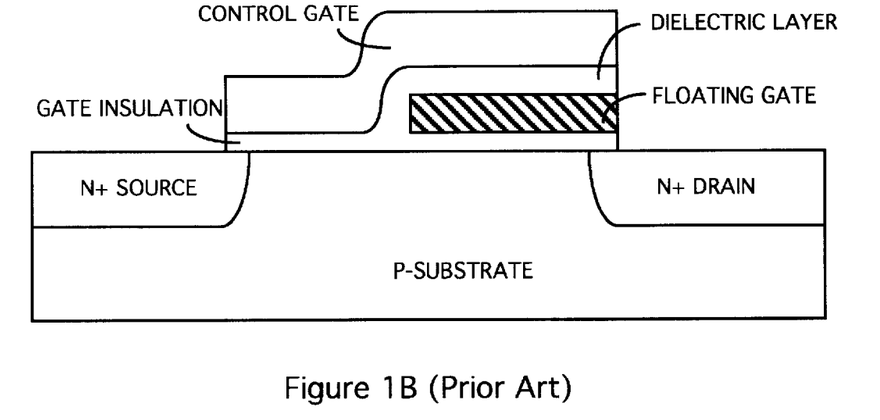

Typical structures of a memory cells are shown in FIG. 1A, as published in "A single Transistor EEPROM Cell and Implementation in A 512K CMOS EEPROM", IEDM Proceedings, Page 616 1985, by Mukerjee et al.) and FIG. 1B, as published in "A 128K Flash EEPROM using Double-polysilicon Technology" IEEE Journal of Solid State Circuits, Vol SC-22, No. 5, page 676, October 1987). In either of these structures, a dielectric layer between the control gate and the floating gate, is formed on top of the floating gate, i.e., a polysilicon layer. The reliability of charge retention by the floating gate is adversely affected due to the irregular surface quality of the polysilicon layer.

Figure 1C:
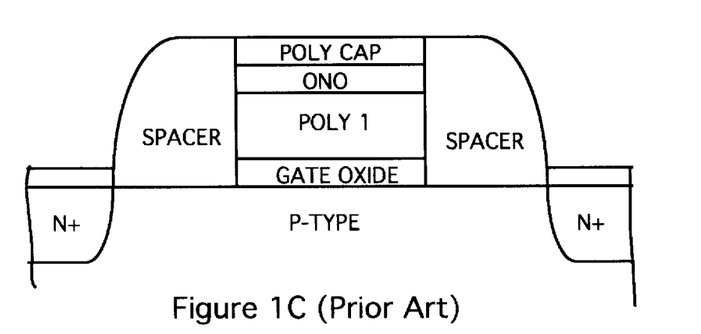

A typical structure of a memory cell is also shown in FIG. 1C in a U.S. Pat. No. 5,397,725 entitled 'Method of Controlling Oxide Thinning in an EPROM of Flash Memory Array' (issued on Mar. 14, 1995), Wolstenholme et al. This Patent discloses a method of fabricating an EPROM or a flash memory array structure that controls oxide thinning to prevent shorts in the array and trenching of the bit lines. As shown in FIG. 1C, a virtual ground buried bit line EPROM or flash array cell structure is formed which reduces the oxide thinning during the formation of the layer of differential oxide with improved processing steps and structural features. It can be appreciated that not only the processing steps are more complicate and costly, but also that the dielectric ONO layer has to formed on top a polysilicon layer. The technical difficulties of such a layer structure still remains that reliability of data storage integrity may be jeopardized due to the unreliable charge retention of polysilicon with an interface plane developed with an ONO layer on top which has a poor quality.

Therefore, there is still a need in the art of semiconductor memory device fabrication, particularly on the programmable read-only memory (PROM) and dynamic random access memory (DRAM) devices, where dielectric layers are to be formed on top of polysilicon layer, to provide a structure and fabrication process that would resolve these limitations.

SUMMARY OF THE PRESENT INVENTION

It is therefore an object of the present invention to provide an improved memory cell structure and fabrication process by forming oxide-nitrite-oxide (ONO) layer directly on the top surface of a substrate such as silicon to overcome the aforementioned difficulties encountered in the prior art Specifically, it is an object of the present invention to provide an improved memory cell structure and fabrication process by forming oxide-nitrite-oxide (ONO) layer directly on the top surface of a substrate wherein better reliability of charge retention is achieved because the poor dielectric characteristics between a floating gate and a control gate is eliminated.

Another object of the present invention is to provide an improved memory cell structure and fabrication process by providing a novel flip-control-gate structure where a flip control gate region is formed in a substrate with a polysilicon layer as floating gate thus enabling the formation of oxide-nitrite-oxide (ONO) layer directly on the top surface of a substrate to achieve better performance, lower the step height while maintaining the same cell size to avoid any cell size penalty.

Another object of the present invention is to provide an improved memory cell structure and fabrication process by providing a floating gate extension where a control gate is on an ONO layer which is formed on top the floating gate extension for connection to the foliating gate with a barrier contact whereby the ONO layer can be formed on the substrate because the floating gate extension is formed as a region in the substrate.

Another object of the present invention is to provide an improved memory cell structure and fabrication process by forming oxide-nitrite-oxide (ONO) layer directly on the top surface of a substrate such that simplified cell structure and cost savings in device fabrication are achieved because only single polysilicon layer processing step is required in the novel cell structure of this invention.

Another object of the present invention is to provide an improved memory cell structure and fabrication process by forming oxide-nitrite-oxide (ONO) layer directly on the top surface of a substrate which enables an integration of PROM and DRAM cells to embed in a single chip.

Another object of the present invention is to provide an improved memory cell structure and fabrication process by forming oxide-nitrite-oxide (ONO) layer directly on the top surface of a substrate wherein the total step height of the PROM cell is reduced thus enhancing subsequent device manufacture integration.

Two novel semiconductor device structures are disclosed in the present invention. The first novel structure is a "flip control gate" structure. In contrast to a conventional device structure where a control gate is formed above a top surface of a semiconductor chip, in a novel structure of this invention, the control gate is formed in the substrate as part of the semiconductor chip near the top surface. Savings in semiconductor surface areas, i.e., chip real estate, and improvement in performance characteristics are achieved by the use of this flip control gate structure. In the second novel device structure, a floating gate extension is employed which is formed as a floating gate extension region in the substrate. By the use of this floating gate extension region, a device designer is provided with greater degree of freedom to implement various improvements of the device structure, including but not limited to the flexibility to form a dielectric structure, e.g., an oxide-nitride-oxide (ONO) structure, directly on the surface of the substrate instead on the surface of a polysilicon as that most frequently implemented in a conventional memory device.

Specifically, in a preferred embodiment, the present invention includes a memory formed on a supporting substrate, the memory device including a control gate for applying a control gate voltage thereon wherein the control gate formed as a control gate region in the substrate. In another preferred embodiment, the memory device further includes a floating gate and a dielectric layer wherein the dielectric layer formed on top of the control gate region with the floating gate covering over the dielectric layer. In a preferred embodiment, the dielectric layer is an oxide-nitride-oxide (ONO) layer with a control gate contact formed on top of the control gate region. The memory device further includes a transistor region in the substrate which includes a source region, a drain region disposed on opposite side of the floating gate.

In yet another preferred embodiment, the present invention includes a memory cell formed on a supporting substrate. The memory cell including a floating gate for charge retention therein and wherein the supporting substrate including a region formed as a floating gate extension region in electrical contact with the floating gate and extending, in the substrate, beyond a region covered by the floating gate. In another preferred embodiment, the present invention includes a memory formed on a supporting substrate, the memory device including a control gate for applying a control gate voltage thereon wherein the control gate formed as a control gate region in the substrate. In yet another preferred embodiment of the present invention, it includes a programmable read-only-memory (PROM). The PROM is formed and supported on a substrate. The PROM includes a transistor region in the substrate including a source region, a drain region and a channel disposed between the drain region and the source region. The PROM further includes a floating gate formed on top of the channel with a single poly layer on the substrate. The PROM further includes a floating gate extension region disposed near the transistor region, the floating gate extension region is connected with the floating gate. The PROM further includes a control gate formed on the substrate near the floating gate extension region opposite the transistor region whereby a charge state of the floating gate extension region is controlled by the control gate.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 2A:
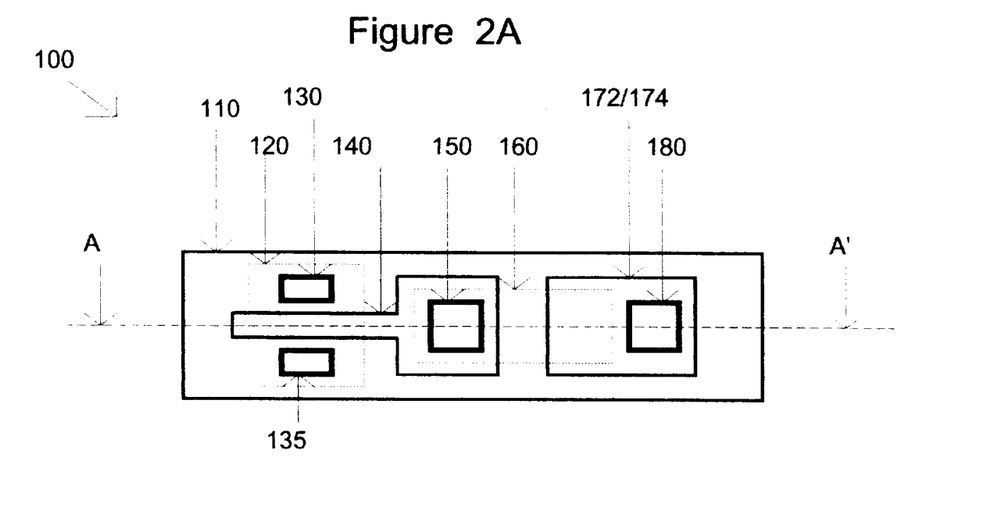
FIGS. 2A and 2B are a top and a cross-sectional views respectively of a PROM device implementing a novel floating gate extension structure of the present invention formed on a SOI substrate.
Figure 2B:
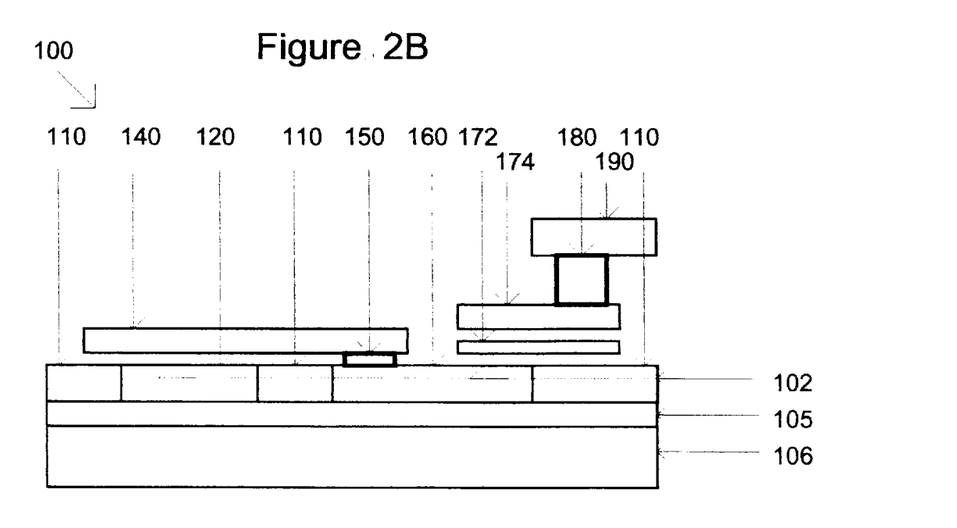

Referring to FIGS. 2A and 2B for a top view and a side cross-sectional view respectively of a programmable read only memory (PROM) cell 100 formed in a silicon on insulator (SOI) wafer. The SOI PROM cell 100 is formed on a device layer 102 which is a thin layer formed on top of an insulation layer 105 supported by a substrate 106 and surrounded by a lateral isolation 110. The cell 100 includes a transistor region 120 formed in the device layer 102 wherein a source contact 130 and drain contact 135 are formed on top of a source region and a drain region respectively formed in the transistor region 120 on opposite sides of a floating gate 140. A barrier contact 150 is formed beneath the floating gate 140. The barrier contact is in electrical contact with the floating gate 140 and a floating gate extension region 160 formed in the device layer 102. A control gate region is formed on top of the floating gate extension region 160 opposite said barrier contact 150. The control gate region includes an oxide-nitride-oxide (ONO) layer 172 formed on top of the floating gate extension region 160 then covered by a control gate 174. The ONO layer 172 includes a nitride layer sandwiched by two oxide layers. A contact 180 is formed on top of the control gate 174 for connection to external circuit via an interconnect line 190.

The process of fabricating the SOI PROM cell 100 started with an SOI wafer which includes the device layer 102 formed on top of an insulation layer 105 supported by a substrate 106. The lateral isolation 110 layer is first formed by field oxidation or trench isolation to define the transistor region 120, the floating gate region underneath the floating gate 140 and the floating gate extension region 160. A thin layer of oxide is thermally grown and covered with a thin nitride layer to form the lower layers of the ONO region 172. A photolithrograph process is carried out with a mask to remove portions of the nitride and oxide. A top oxide layer of the ONO region 172 and a gate oxide layer of the floating gate are then thermally grown simultaneously on top of the lower layers of the ONO region 172 to complete the formation of the ONO region 172. A barrier contact 150 is formed by masked etching. A layer of ploy is then deposited with mask to form the floating gate 140 and the control gate 174. The entire cell 100 is then covered with a dielectric layer (not shown). The source and drain contacts 130 and 135 and the control gate contact are then formed by removing the dielectric layer and forming contacts and the interconnect line 190 thereon by employing standard interconnect processing steps.

A memory device 100 including a floating gate 140 and control gate 174 supported on a device layer 102 is disclosed in this invention. The memory device 100 includes a floating gate extension region 160 formed in the device layer 102 connected to the floating gate 140 and extends therefrom to a control gate region under the control gate 174 whereby a charge state of the floating gate extension region 160 is controlled by the control gate 174. A novel design concept is disclosed in this invention that a portion of the device layer 102, e.g., a silcion region, is used as a floating gate extension. In a preferred embodiment, the memory device 100 includes a transistor region 120 in the device layer 102 including a source region, a drain region disposed on opposite side of the floating gate 160. In another preferred embodiment, a dielectric layer region 172 is formed on top of the control gate region underneath the control gate 174. In a preferred embodiment, the dielectric layer 172 is an oxide-nitride-oxide (ONO) layer.

The SOI PROM cell 100 is now provided with a ONO layer 172 with improved quality compared with a conventional PROM since the ONO layer 172 is now formed on a silicon surface which has a single crystal structure instead of the conventional structure where ONO is formed on a polysilicon layer which has a rough surface due to the irregular grain sizes of the polysilicon. Because the improved quality of the ONO layer, better charge retention control is achieved. The fabrication process is simplified with the PROM disclosed in this invention because only single poly processing step is required to form the floating gate 140 and the control gate 174 simulataneously. The step height of the PROM cell 100 is reduced compared with a conventional PROM as the floating gate extension is used to connect the floating gate 140 with the control gate 174 which simplifies the manufacture process employing the PROM cell 100.

A memory device 100 including a floating gate 140 and control gate 174 supported on a device layer 102 is disclosed in this invention. The memory device 100 includes a transistor region 120 in the substrate 106. The transistor region 120 includes a source region undeerneath a source contact 130, a drain region underneath a drain contact 135 disposed on opposite side of the floating gate 140. The memory device 100 further includes a floating gate extension region 160 in the device layer 102 connected to the floating gate 140 and extends therefrom to a control gate region under the control gate 174 whereby a charge state of the floating gate extension region 160 is controlled by the control gate 174. In a preferred embodiment, the memory device further includes a dielectric layer region 172 disposed on top of the control gate region underneath the control gate 174. In yet another preferred embodiment, the dielectric layer 172 is an oxide-nitride-oxide (ONO) layer.

Figure 3:
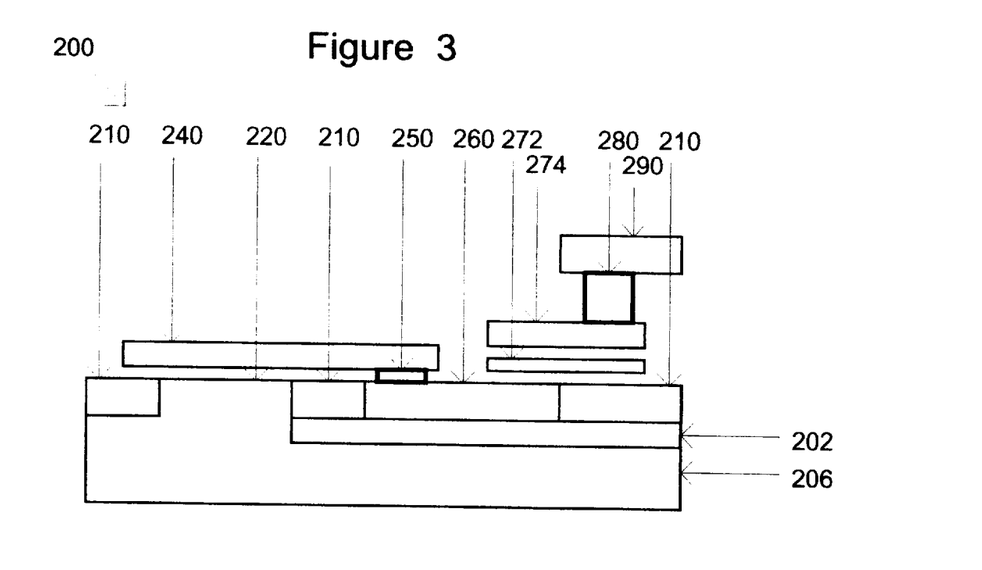
FIG. 3 is a cross-sectional view of a PROM cell implementing a novel floating gate extension structure of the present invention formed on a regular substrate.

Referring to FIG. 3A and 3B of another preferred embodiment of the present invention when a PROM cell 200 is formed on a substrate 206 which includes a conventional wafer including a barrier layer 202 formed therein. The PROM cell 200 is surrounded by a lateral isolation layer 210 for cell isolation. The PROM cell includes a transistor region 220 which is free of isolation from the substrate 206. Similar to that is shown in FIG. 1, in the transistor region 220, a drain and a source contacts are formed thereon on opposite sides of a gate region under a floating gate 240. A barrier contact 250 which is in electrical communication with the floating gate 240 and a floating gate extension region 260 is formed on the right hand side of the floating gate area under the floating gate 240. The floating gate extension region is formed on the right portion on top of the barrier layer 202 and isolated form the transistor region 220 by the lateral isolation layer 210. A control gate region is situated on top of the floating gate extension region 260 opposite the barrier contact 250. The control gate region includes an oxide-nitride-oxide (ONO) region 272 formed on top of the floating gate extension 260 then covered by a control gate 274. The ONO region 272 includes a nitride layer sandwiched by two oxide layers. A contact 280 is formed on top of the control gate 274 for connection to external circuit via an interconnect line 290.

The process of fabricating the PROM cell 200 started with a conventional wafer which forms a substrate 206. A barrier oxide layer 202 is formed by patterned $O_2$ implantation and then thermally treated. The lateral isolation 210 layer is first formed to define the transistor region 220 and the floating gate extension region 260. A thin layer of oxide is thermally grown and then covered with nitride to form the lower layers of the ONO region 272. A photolithrograph process is carried out with a mask to remove portions of the nitride and oxide. To complete the formation of the ONO region 272, a top oxide layer on top of the lower layers of the ONO region 272 and a gate oxide layer of the floating gate 240 are then thermally grown simultaneously. A barrier contact 250 is formed by by masked etching. A layer of ploy is then deposited with mask to form the floating gate 240 and the control gate 274. The entire cell 200 is then covered with a dielectric layer (not shown). The source and drain contacts 230 and 235 and the control gate contact are then formed by removing the dielectric layer and forming contacts and the interconnect line 290 thereon by employing standard interconnect processing steps.

Figure 4A:
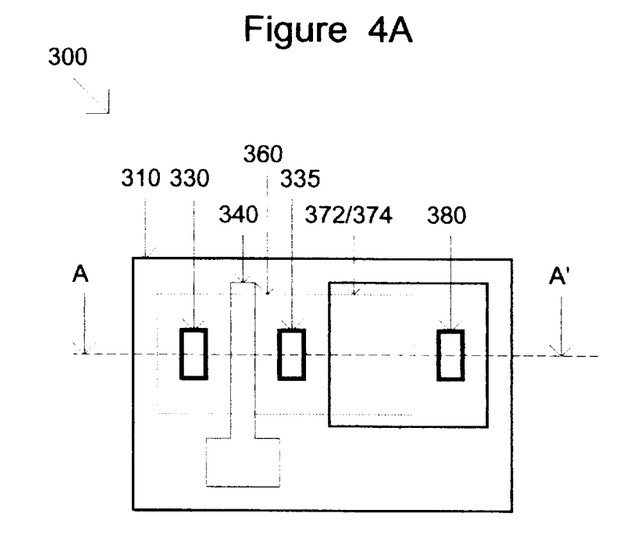
FIGS. 4A–4B are the top and cross sectional views respectively for a SOI DRAM cell of the present invention.
Figure 4B:
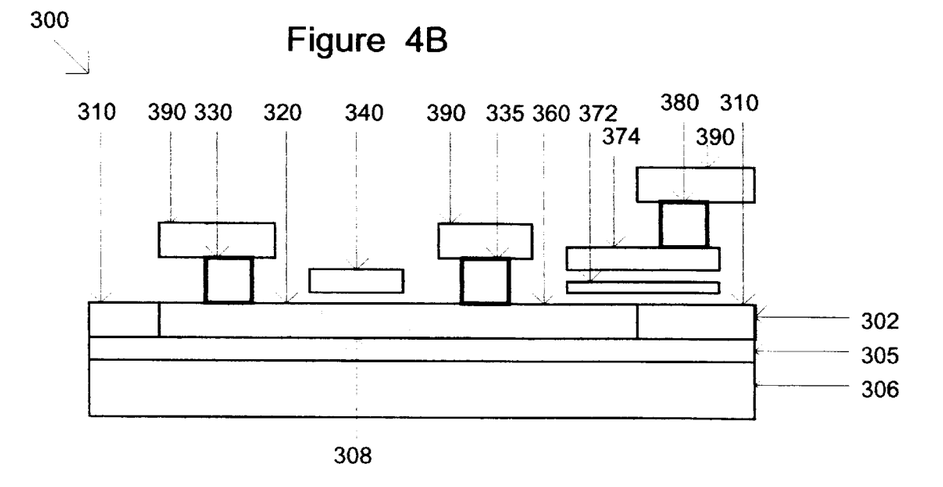

Referring to FIGS. 4A and 4B for a top view and cross sectional view respectively of a silicon on insulator (SOI) dynamic random access memory (DRAM) cell 300 of the present invention. The SOI DRAM formed in a device layer 302 which is insulated by an insulation layer 305, e.g., a silicon oxide layer, supported on a substrate 306. The SOI DRAM is surrounded and isolated by a lateral isolation layer 310 thus defining a transistor region 308 in the device layer 302. A gate 340 is formed on the top surface of the device layer 302 in the middle part of the transistor region 308 wherein the drain region 320 is formed on the left side with a drain contact 330 formed thereon. A source region 360, in the device layer 302, is formed on the right hand side of the gate 340 opposite the drain region 320. A capacitor region is formed in the right portion of the source region 360. The capacitor region includes an oxide-nitride-oxide (ONO) region 372 formed on top of the source region 360 then covered by a capacitor node 374. The ONO region 372 includes a nitride layer sandwiched by two oxide layers. A contact 380 is formed on top of the control gate 374. Connection to external circuit are then established by use of an interconnect line 390 formed on top of the drain contact 330, the source contact 335, and a contact 380 on top of the capacitor node 374.

The process of fabricating the SOI DRAM cell 300 started with an SOI wafer which includes the device layer 302 formed on top of an insulation layer 305 supported by a substrate 306. The lateral isolation 310 layer is first formed to define the transistor region 308 in the device layer 302 to form the drain region 320, the gate region 340 and the source region 360 to be formed with a capacitor region thereon. A thin layer of oxide is thermally grown and covered with nitride to form the lower layers of the ONO region 372. A photolithrograph process is carried out with a mask to remove portions of the nitride and oxide. To complete the formation of the ONO region 372, a top oxide layer is formed on top of the lower layers of the ONO region 372 which is simulataneously formed with a gate oxide layer of the transistor. A layer of ploy is then deposited with mask to form the gate 340 and the capacitor node 374. The entire cell 300 is then covered with a dielectric layer (not shown). The source and drain contacts 330 and 335 respectively and the contact 380 for the capacitor node are then formed by removing the dielectric layer and the interconnect line 390 are formed thereon.

Figure 5A:
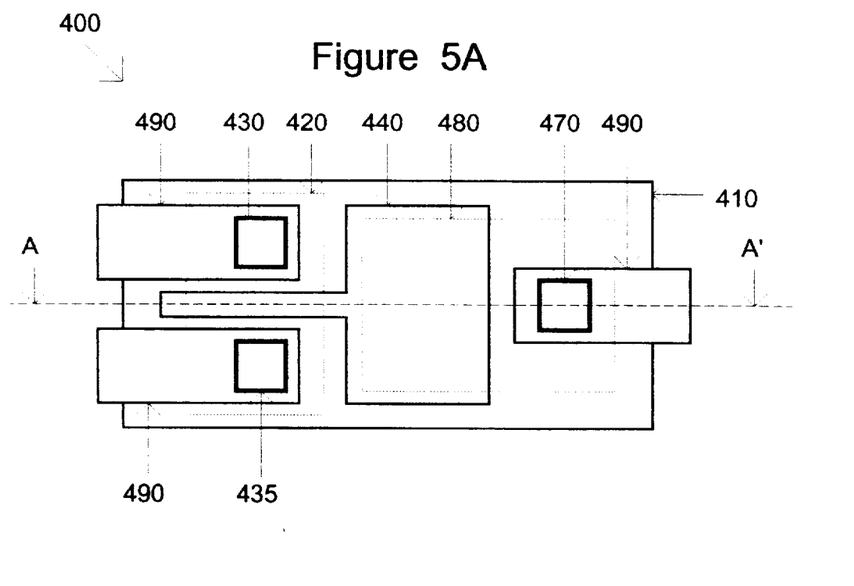
FIGS. 5A–5B are top and cross-sectional views respectively for a SOI PROM cell of an alternate preferred embodiment implementing a novel control gate under floating gate structure of the present invention.
Figure 5B:
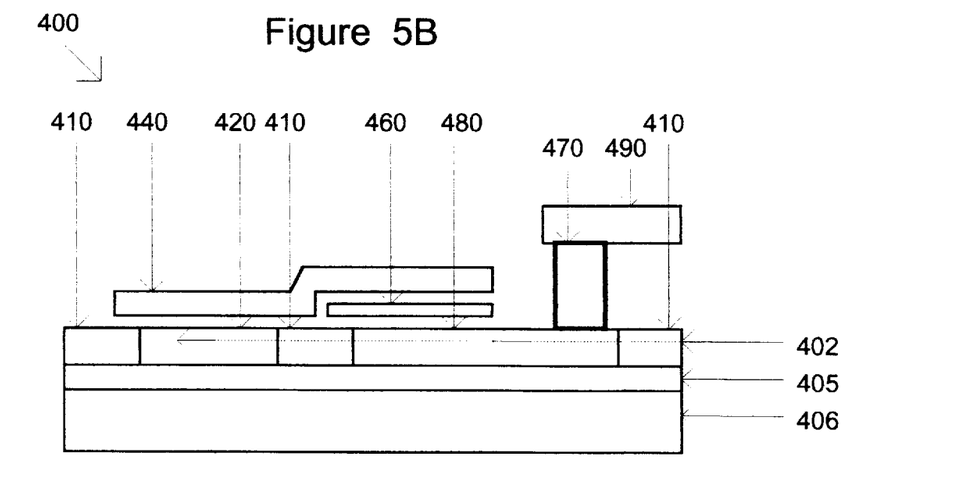

Please refer to FIGS. 5A and 5B where a top view and a cross-sectional view of a memory device, i.e., a PROM 400, are shown respevtively. The PROM cell 400 has a novel flip-control-gate structure wherein a control gate is formed as a region in the substrate. The PROM cell 400 is formed in a silicon on insulator (SOI) wafer which includes a device layer 402, an insulation layer 405 supported by the substrate 406 and surrounded by a lateral isolation 410. The cell 400 includes a transistor region 420 formed in the device layer 402 wherein a source contact 430 and drain contact 435 are formed on top of a source region and a drain region respectively formed in the transistor region 420 on opposite sides of a floating gate 440. The cell 400 further includes a control gate region 480 which is formed opposite the transistor region 420 and insulated from the transistor region by the lateral isolation 410. This is a special flip-control-gate configuration where a control gate is formed as a layer, i.e., a control gate region 480 in the device layer 402 rather than a regular layer above the top surface of the device layer 402. A dielectric layer 460, e.g., an ONO layer, is formed on top of the control gate region 480 cover a portion of the top surface of the control gate region 480. A control gate contact 470 is formed on top of the control gate region 480 which is in turn connected to interconnect line 490 for providing control gate voltage therefrom. The floating gate 440, formed with a polysilicon layer is extended from the transistor region 420 over the lateral isolation 410 to overlay the dielectric layer 460 on top of the control gate 480. In this novel structure, the dielectric layer, i.e., ONO layer 460 is formed directly on a silicon surface. This structure further has the benefits that simplified processing steps are employed because fewer layers are required. Furthermore, the cell size is not expanded when compared with a conventional PROM cell.

The process of fabricating the SOI PROM cell 400 started with an SOI wafer which includes the device layer 402 formed on top of an insulation layer 405 supported by a substrate 406. The lateral isolation 410 layer is first formed by field oxidation or trench isolation to define the transistor region 420, and the control gate region 480. A thin layer of oxide is thermally grown and covered with nitride to form the lower layers of the ONO region 460. A photolithrograph process is carried out with a mask to remove portions of the nitride and oxide. To complete the formation and patterning of the ONO layer 460, an oxide layer on top of the lower layers of the ONO region, and another gate oxide layer for the floating gate are thermally grown simultaneously. A layer of polysilicon is then deposited with mask to form the floating gate 440 to extend from the transistor region 420 and overlaying the ONO layer 460. The entire cell 400 is then covered with a dielectric layer (not shown). The source and drain contacts 430 and 435 and the gate contact 470 are then formed by removing the dielectric layer and forming contacts and the interconnect line 490 thereon by employing standard interconnect processing steps.

Figure 6:
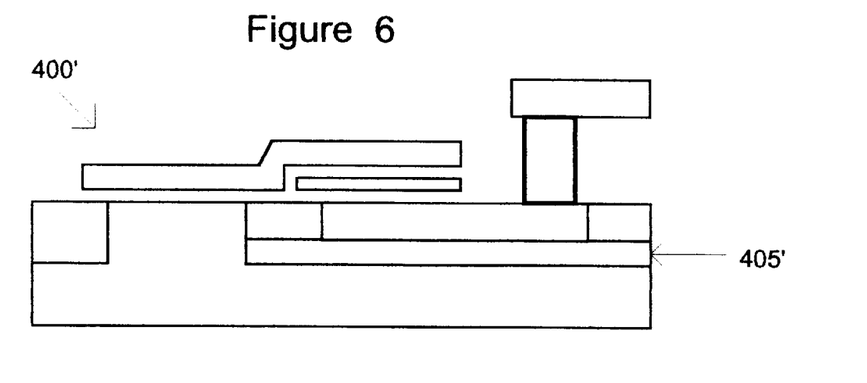
FIG. 6 is a cross sectional view of a PROM cell of FIGS. 5A and 5B implementing a novel control gate under floating gate structure formed on a regular non-SOI substrate.

Referring to FIG. 6 for another similar PROM cell 400' formed on a conventional wafer. The structure is basically identical to that described for the PROM cell 400 as shown in FIGS. 5A and 5B, except that a barrier oxide isolation 405' is formed underneath the control gate 480 instead of an isolation layer 405 for a SOI wafer. Additional processing step include the formation of a barrier oxide layer 405' by patterned $O_2$ implantation and then thermally treated. The post barrier oxidation fabrication processes, and the operational functions are similar to a PROM cell 400 as that shown in FIGS. 5A and 5B. The PROM cell 400' has the similar advantages as that of PROM 400 including simplified fabrication process, better ONO quality and no cell-size penalty as a result of providing these novel features and technical benefits.

A memory device 400 with a novel structure is disclosed in this invention which includes a control gate 480 for applying a control gate voltage thereon. The memory device is formed in a supporting device layer 402 wherein the control gate is formed as a control gate region in the device layer 402. In a preferred embodiment, the memory device 400 further includes a floating gate 440 and a dielectric layer 460 wherein the dielectric layer 440 formed on top of the control gate region 480 with the floating gate 440 covering over the dielectric layer 460.

Therefore, the present invention provides an improved memory cell structure and fabrication process by forming oxide-nitrite-oxide (ONO) layer directly on the top surface of a substrate, such as silicon, to overcome the difficulties encountered in the prior art. Specifically, since the oxide-nitrite-oxide (ONO) layer is formed directly on the top surface of a substrate, better reliability of charge retention is achieved because the problem caused by poor surface quality between polysilicon and dielectric layer interface is now eliminated. Also, by providing the improved memory cell structure and fabrication process in forming oxide-nitrite-oxide (ONO) layer directly on the top surface of a substrate, simplified cell structure and cost savings in device fabrication are achieved because only single polysilicon layer processing step is required in these novel cell structures as disclosed in this invention. Additionally, by forming oxide-nitrite-oxide (ONO) layer directly on the top surface of a substrate, the total step height of the PROM cell is reduced thus enhancing device manufacture integration.

Another advantage of the present invention is that it provides an improved memory cell structure and fabrication process in forming oxide-nitrite-oxide (ONO) layer directly on the top surface of a substrate wherein the process sequences for fabricating the PROM and DRAM cells are both simplified and become very similar. Because of the similarity of processing flow in device fabrication, an integration of PROM and DRAM cells to embed these memory cells in a single chip is now realized. A single chip with integrated PROM and DRAM cells formed therein can provide many high speed applications which are not yet achievable by system which employs a separate PROM and SRAM cells configuration.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A memory cell formed on a supporting substrate, said memory cell including a floating gate for charge retention therein wherein:

said supporting substrate including a floating gate extension region in electrical contact with said floating gate and extending, in said substrate, laterally beyond a region covered by said floating gate; and a barrier contact disposed on said substrate with a lateral distance away from said floating gate provided for contacting a switching means for controlling said floating gate extension region and said floating gate.

2. A memory device including a floating gate and control gate supported on a substrate wherein said memory device comprising:

a floating gate extension region formed in said substrate connected to said floating gate and extends laterally therefrom to a control gate region under said control gate disposed with a lateral distance away from said floating gate whereby a charge state of said floating gate extension region is controlled by said control gate.

3. The memory device as recited in claim 2 further comprising:
   a transistor region in said substrate divided by said floating gate into a first side and second side which further includes a source region disposed on said first side with a distance away from said floating gate and a drain region disposed on said second side opposite said first side with a distance away from said floating gate.

4. The memory device as recited in claim 3 further comprising:
   a dielectric layer disposed on top of said control gate region underneath said control gate whereby said dielectric layer is disposed directly on said substrate.

5. The memory device as recited in claim 4 wherein:
   said dielectric layer is an oxide-nitride-oxide (ONO) layer and said substrate being a silicon substrate whereby said ONO layer is formed directly on said silicon substrate.

6. A memory device formed on a supporting substrate, said memory device including a control gate for applying a control gate voltage thereon wherein:
   said control gate formed as a control gate region in said substrate for direct contact with a control gate contact therefrom; and
   a dielectric layer disposed directly on top of said control gate region disposed at a lateral distance away from said control gate contact whereby said dielectric layer is disposed directly on top of said substrate.

7. The memory device as recited in claim 6 further comprising:
   a floating gate covering over and electrically coupled to said control gate via said dielectric layer wherein said floating gate composed of a polysilicon layer and further extended beyond said dielectric layer to dispose directly on said substrate whereby said memory device is provided with a single polysilicon structure.

8. The memory device as recited in claim 7 wherein:
   said dielectric layer is an oxide-nitride-oxide (ONO) layer and said substrate is a silicon substrate whereby said ONO layer is disposed directly on said silicon substrate.

9. The memory device as recited in claim 8 further comprising:
   said control gate contact disposed directly on top of said control gate region for contacting an interconnect line therefrom.

10. The memory device as recited in claim 9 further comprising:
    a transistor region in said substrate divided by said floating gate into a first side and second side which further includes a source region disposed on said first side with a distance away from said floating gate and a drain region disposed on said second side opposite said first side with a distance away from said floating gate.

11. A programmable read-only-memory (PROM) comprising:
    a substrate for supporting said PROM thereon;
    a transistor region in said substrate including a source region, a drain region and a floating gate region disposed between said drain region and said source region;
    a floating gate formed on top of said floating gate region with a single polysilicon layer on said substrate;
    a floating gate extension region disposed near said transistor region, said floating gate extension region is connected with said floating gate region and extending laterally away from said floating gate region; and
    a control gate defined by a polysilicon layer on said substrate near said floating gate extension region opposite said transistor region disposed with a lateral distance away from said floating gate whereby a charge state of said floating gate extension region is controlled by said control gate and said PROM is provided as a single polysilicon device.

12. A programmable read-only-memory PROM comprising:
    a substrate for supporting said PROM thereon wherein said substrate is a silicon on insulator (SOI) substrate including an oxide layer formed in said substrate for supporting and insulating a device layer near the top surface of said substrate for forming said PROM therein;
    a transistor region in said substrate including a source region, a drain region and a floating gate region disposed between said drain region and said source region;
    a floating gate formed on top of said floating gate region with a single polysilicon layer on said substrate;
    a floating gate extension region disposed near said transistor region, said floating gate extension region is connected with said floating gate region; and
    a control gate defined by a polysilicon layer on said substrate near said floating gate extension region opposite said transistor region disposed with a lateral distance away from said floating gate whereby a charge state of said floating gate extension region is controlled by said control gate and said PROM is provided as a single polysilicon device.

13. The PROM as recited in claim 12 further comprising:
    a dielectric layer formed underneath said control gate wherein said dielectric layer is formed directly on said substrate.

14. The PROM as recited in claim 13 wherein:
    said dielectric layer formed directly on a substrate is an oxide-nitride-oxide (ONO) layer and said substrate is a silicon substrate whereby said ONO layer is disposed directly on said silicon substrate.

15. The PROM as recited in claim 13 further comprising:
    a barrier contact disposed below said floating gate for establishing an electric contact of said floating gate with said floating gate extension region thus forming an electrical extension for said floating gate for connecting to said control gate disposed with a lateral distance away from said floating gate.

16. A programmable read-only-memory (PROM) comprising:
    a substrate for supporting said PROM thereon wherein said substrate is a silicon on insulator (SOI) substrate including an oxide layer formed in said substrate for supporting and insulating a device layer near the top surface of said substrate for forming said PROM therein;
    a transistor region in said substrate including a source region, a drain region and a floating gate region disposed between said drain region and said source region;
    a floating gate formed on top of said floating gate region with a single polysilicon layer on said substrate;
    a floating gate extension region disposed near said transistor region, said floating gate extension region is connected with said floating gate region;
    a control gate formed on said substrate near said floating gate extension region opposite said transistor region whereby a charge state of said floating gate extension region is controlled by said control gate; and a dielectric layer formed underneath said control gate above said floating gate extension region wherein said dielectric layer is oxide-nitride-oxide (ONO) layer formed directly on said substrate.

17. The PROM as recited in claim 16 further comprising:

a barrier contact formed below said floating gate for establishing an electric contact of said floating gate with said floating gate extension region thus forming an electrical extension for said floating gate.

18. A dynamic random-access-memory (DRAM) comprising:

a substrate for supporting said DRAM thereon wherein said substrate is a silicon on insulator (SOI) substrate including an oxide layer formed in said substrate for supporting and insulating a device layer near the top surface of said substrate for forming said DRAM therein;

a transistor region including a source region, a drain region and a gate region disposed between said source region and said drain region; and a capacitor region formed near said source region including a dielectric layer formed directly on said substrate and a control gate contact formed on top of said dielectric layer wherein said dielectric layer in said capacitor region is an oxide-nitride-oxide (ONO) layer.

19. A flip-control-gate programmable read-only-memory (PROM) comprising:

a substrate for supporting said PROM thereon;

a transistor region in said substrate including a source region, a drain region and a channel disposed between said drain region and said source region;

a floating gate formed on top of said channel with a single polysilicon layer on said substrate; and a control gate region formed in said substrate opposite said transistor region and insulated therefrom for direct contact with a control gate thereto wherein said floating gate extends laterally from said transistor region to said gate region and a state of said floating gate is controlled by said control gate region and with said polysilicon layer defining said floating gate thus constituting a single polysilicon-layer memory device.

20. A flip-control-gate programmable read-only-memory (PROM) comprising:

a substrate for supporting said PROM thereon wherein said substrate is a silicon on insulator (SOI) substrate including an oxide layer formed in said substrate for supporting and insulating a device layer near the top surface of said substrate for forming said PROM therein;

a transistor region in said substrate including a source region, a drain region and a channel disposed between said drain region and said source region;

a floating gate formed on top of said channel with a single polysilicon layer on said substrate; and a control gate region formed in said substrate opposite said transistor region and insulated wherein said floating gate extends from said transistor region to said gate region and a state of said floating gate is controlled by said control gate region.

21. The PROM as recited in claim 20 further comprising:

a dielectric layer formed underneath said floating gate wherein said dielectric layer is formed directly on said substrate.

22. The PROM as recited in claim 21 wherein:

said dielectric layer formed directly on a substrate is an oxide-nitride-oxide (ONO) layer and said substrate is a silicon substrate whereby said ONO layer is disposed directly on said silicon substrate.

23. The PROM as recited in claim 19 further comprising:

a barrier oxide layer formed below said control gate region for insulating said control gate region disposed with a distance laterally away from said transistor region.

24. A programmable read-only-memory (PROM) with an embedded DRAM on a same chip, comprising:

a substrate for supporting said PROM and said embedded DRAM thereon;

a PROM transistor region in said substrate including a PROM source region, a PROM drain region and a PROM channel disposed between said PROM drain region and said PROM source region;

said PROM further includes a floating gate formed on top of said channel with a single polysilicon layer on said substrate;

said PROM further includes a floating gate extension region disposed near said transistor region, said floating gate extension region is connected with said channel;

said PROM further includes a PROM control gate formed on said substrate near said floating gate extension region opposite said PROM transistor region whereby a charge state of said floating gate extension region is controlled by said PROM control gate;

a DRAM transistor region including a DRAM source region, a DRAM drain region and a DRAM gate region disposed between said source region; and a capacitor region formed near said DRAM source region including a dielectric layer formed directly on said substrate and a DRAM control gate contact formed on top of said dielectric layer.

25. A programmable read-only-memory (PROM) with an embedded DRAM on a same chip, comprising:

a substrate for supporting said PROM and said embedded DRAM thereon;

a PROM transistor region in said substrate including a PROM source region, a PROM drain region and a PROM channel disposed between said PROM drain region and said PROM source region;

said PROM further includes a floating gate formed on top of said channel with a single polysilicon layer on said substrate;

said PROM further includes a PROM control gate disposed outside of said transistor region, said PROM control gate is formed as a region in said substrate with said floating gate extending to a top surface above said PROM control gate with a dielectric layer between said floating gate and said PROM control gate whereby a charge state of said floating gate is controlled by said PROM control gate;

a DRAM transistor region including a DRAM source region, a DRAM drain region and a DRAM gate region disposed between said source region; and a capacitor region formed near said DRAM source region including a dielectric layer formed directly on said substrate and a DRAM control gate contact formed on top of said dielectric layer.

* * * * *